(12) United States Patent
Nagasu

(10) Patent No.: US 10,068,687 B2
(45) Date of Patent: Sep. 4, 2018

(54) METHOD FOR PRODUCING SUPERCONDUCTIVE CONDUCTOR AND SUPERCONDUCTIVE CONDUCTOR

(71) Applicant: FURUKAWA ELECTRIC CO., LTD., Chiyoda-ku, Tokyo (JP)

(72) Inventor: Yoshinori Nagasu, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 215 days.

(21) Appl. No.: 14/775,614

(22) PCT Filed: Feb. 5, 2014

(86) PCT No.: PCT/JP2014/052639
§ 371 (c)(1),
(2) Date: Sep. 11, 2015

(87) PCT Pub. No.: WO2014/141777
PCT Pub. Date: Sep. 18, 2014

(65) Prior Publication Data
US 2016/0027555 A1 Jan. 28, 2016

(30) Foreign Application Priority Data
Mar. 15, 2013 (JP) .................. 2013-053512

(51) Int. Cl.
*H01B 12/02* (2006.01)
*H01F 6/06* (2006.01)
(Continued)

(52) U.S. Cl.
CPC ............. *H01B 12/02* (2013.01); *H01B 1/026* (2013.01); *H01L 39/143* (2013.01);
(Continued)

(58) Field of Classification Search
None
See application file for complete search history.

(56) References Cited

U.S. PATENT DOCUMENTS 4,688,132 A * 8/1987 Dustmann ............... H01F 6/005
335/216
5,143,897 A 9/1992 Ziemek et al.
(Continued)

FOREIGN PATENT DOCUMENTS

CN 101292369 A 10/2008
GB 1222624 A 2/1971
(Continued)

OTHER PUBLICATIONS

Machine translation of JPH06325629, generated by Espacenet Oct. 16, 2017, pp. 1-14.*
(Continued)

*Primary Examiner* — Colleen P Dunn
(74) *Attorney, Agent, or Firm* — Amin, Turocy & Watson, LLP

(57) ABSTRACT

A superconductive wire conductor is produced by: embedding a plurality of deposition substrates formed to have a predetermined size in parallel with each other to a connection base material to connect and integrate therewith; depositing an intermediate layer, a superconductive layer and a protective layer on a deposition surface side of the deposition substrate; and winding a single or multiple integrated superconductive conductors around a desired core material, separating each single superconductive wire from the integrated superconductive conductor and winding each superconductive wire around the core material or winding the integrated or separated wire alternately, whereby a super-
(Continued)

conductive conductor having a good superconductive characteristic without a problem regarding a shape thereof such as local protrusions.

6 Claims, 3 Drawing Sheets

(51) Int. Cl.
*H01L 39/00* (2006.01)
*H01L 39/14* (2006.01)
*H01L 39/24* (2006.01)
*H01B 1/02* (2006.01)
*H05K 3/10* (2006.01)
*H05K 3/26* (2006.01)

(52) U.S. Cl.
CPC .......... *H01L 39/2454* (2013.01); *H05K 3/10* (2013.01); *H05K 3/26* (2013.01); *H01F 6/06* (2013.01); *H01L 39/2441* (2013.01)

(56) References Cited

U.S. PATENT DOCUMENTS

| 7,816,303 B2 | 10/2010 | Thieme et al. |
| 2006/0073979 A1 | 4/2006 | Thieme et al. |
| 2013/0137579 A1 | 5/2013 | Nagasu et al. |

FOREIGN PATENT DOCUMENTS

| JP | S64-65722 A | 3/1989 |
| JP | H01-130421 A | 5/1989 |
| JP | H02-61910 A | 3/1990 |
| JP | H04-264315 A | 9/1992 |
| JP | H06-068727 A | 3/1994 |
| JP | H06-325629 A | 11/1994 |
| JP | H10-74988 A | 3/1998 |
| JP | 3342739 B2 | 11/2002 |
| JP | 2007-087734 A | 4/2007 |
| JP | 2007-141688 A | 6/2007 |
| JP | 2007-188844 A | 7/2007 |
| JP | 2008-220102 A | 9/2008 |
| JP | 2008-226624 A | 9/2008 |
| JP | 2009-503794 | 1/2009 |
| JP | 2009-048792 A | 3/2009 |
| JP | 2009-110668 A | 5/2009 |
| JP | 2009-151993 A | 7/2009 |
| JP | 2010-135295 A | 6/2010 |
| WO | 2011-163343 A2 | 12/2011 |
| WO | 2013-018870 A1 | 2/2013 |
| WO | 2013018870 | 2/2013 |

OTHER PUBLICATIONS

International Preliminary Report on Patentability dated Sep. 15, 2015 for PCT Application No. PCT/JP2014/052639, 15 pages.
International Search Report dated Mar. 11, 2014 for PCT Application No. PCT/JP2014/052639, 9 pages.
Extended European Search Report dated Apr. 11, 2016 for European Patent Application No. 14763183.2, 9 pages.
Chinese Office Action dated Aug. 1, 2016 for Chinese Application No. 201480012006.9, 17 pages.
Chinese Office Action dated Mar. 13, 2017 for Chinese Application No. 201480012006.9, 13 pages (with translation).
Japanese Office Action dated Jun. 6, 2017 for Japanese Application No. 2015-505319, 7 pages (with translation).
European Office Action dated Jul. 27, 2017 for European Application No. 14763183.2, 4 pages.
Japanese Office Action dated Oct. 3, 2017 for Japanese Application No. 2015-505319, 7 pages (with translation).
European Office Action dated Mar. 7, 2018 for European Application No. 14763183.2, 4 pages.

* cited by examiner

METHOD FOR PRODUCING SUPERCONDUCTIVE CONDUCTOR AND SUPERCONDUCTIVE CONDUCTOR

CROSS-REFERENCE TO RELATED APPLICATIONS

This application is a U.S. National Stage patent application filing under 35 USC § 371 of international Patent Cooperation Treaty (PCT) Application No. PCT/JP2014/052639, filed on Feb. 5, 2014, and entitled "METHOD FOR MANUFACTURING SUPERCONDUCTING CONDUCTOR AND SUPERCONDUCTING CONDUCTOR," which claims priority to Japanese Patent Application No. 2013-053512, filed on Mar. 15, 2013, both of which applications are hereby incorporated by reference herein in their entireties.

TECHNICAL FIELD

The present invention relates to a superconductive conductor to be employed for superconductive equipment such as a superconducting cable and a superconducting magnet and a method for producing a superconductive conductor.

BACKGROUND ART

Conventionally, many attempts to produce a superconductive wire by depositing a superconductive layer on a substrate have been proposed. For obtaining a superconductive wire with a desired wire width, there is a method in which a metal substrate having a desired width is prepared by cutting a metal plate by means of, for example, slit processing, an intermediate layer is formed on a surface of the metal substrate and a superconductive layer exhibiting a good crystalline orientation is deposited on a surface of the intermediate layer. There is also a case where an intermediate layer and a superconductive layer are deposited on a metal substrate having a width larger than a desired width and an obtained superconductive wire is made thinner. In this case, the superconductive wire is cut by methods such as laser cutting and slit processing (for example, refer to Patent Document 1).

As an example of laser cutting, with respect to an oxide superconductive conductor with low alternating current loss, oxide having high resistance is formed in thinning grooves formed along a longitudinal direction of the conductor, and laser is irradiated along the thinning grooves for superconductive layers to be formed as a plurality of filament conductors spaced from each other in a width direction of the conductor (for example, refer to Patent Document 2).

The following methods are disclosed as methods for obtaining a superconductive conductor having a desired critical current capacity from thinned superconductive wires: a method in which backsides of metal substrates of a plurality of thinned superconductive wires are joined repeatedly at regular interval onto a base material which has lower flexural rigidity in comparison to that of the superconductive wire (for example, refer to Patent Document 3); a method in which superconductive wires each thinned so as to have a width of 0.48 mm to 1.8 mm is wound spirally around a core wire having an outer diameter ∅ of 1.3 mm to 5 mm without overlapping with each other (for example, refer to Patent Document 4); and a method in which surfaces of superconductive wires are processed by slit processing so as to each have a width of 0.5 to 2.0 mm and are covered with silver, the superconductive wires are laminated with each other in the vertical direction and thickly plated with copper such that a cross-sectional round shape superconductive conductor is formed (for example, refer to Patent Document 5).

PRIOR ART DOCUMENT

Patent Document

Patent Document 1: JP H06-068727 A
Patent Document 2: JP 2007-141688 A
Patent Document 3: JP 2009-151993 A
Patent Document 4: JP 2009-110668 A
Patent Document 5: JP 2010-135295 A

SUMMARY OF INVENTION

Problem to be Solved by the Invention

However, with respect to methods employing laser cutting, the mark of melt-cutting caused by heat generation appears on cutting surfaces caused by laser, and thus, unevenness occurs in shapes of the cutting surfaces. As a result, there have been problems such as the deterioration of the insulating characteristic of a superconductive conductor due to a local protrusion on the cutting surface and the deterioration of superconductive characteristic (characteristic relating to critical current) in accordance with the thermal history in cutting. Also, with respect to methods of cutting employing slit processing, the protruding mark (i.e., warpage) caused by shearing appears at a cut part similarly to the mark caused by laser cutting, and thus, unevenness occurs in shapes of the cut surfaces. As a result, there have been problems such as the deterioration of the insulating characteristic of a superconductive conductor and the deterioration of superconductive characteristic due to shearing stress.

Methods employing laser cutting are similarly used, not only in a case where a metal substrate and all the layers deposited thereon are cut, but also in a case where only the layers (such as a protective layer, a superconductive layer and an intermediate layer) deposited on the metal substrate are cut such that the superconductive conductors each include a separated superconductive layer and are formed on a single metal substrate. In such cases, there has been a problem with respect to a superconductive conductor, such as the above-described occurrence of the mark due to melt-cutting, which results in local deterioration of the characteristic relating to critical current.

The present invention is made in consideration of the above-described problems and an object of the present invention is to provide a superconductive conductor exhibiting an excellent superconductive characteristic without causing problems regarding its shape such as local protrusions and to provide a method for producing such a superconductive conductor.

BRIEF SUMMARY

A method for producing a superconductive conductor according to one or more embodiments includes preparing a plurality of deposition substrates; preparing a connection base material to be connected with and to be integrated with the plurality of deposition substrates; integrating the plurality of deposition substrates with the connection base material; and depositing a superconductive layer and a protective layer on each of the plurality of deposition substrates.

By integrating the plurality of deposition substrates each having a desired width with the connection base material, and carrying out the deposition thereafter, it is possible to form superconductive wires having the desired width without carrying out laser cutting or slit processing after the deposition.

A superconductive conductor according to the present invention includes: a core material including a core and a stabilizing layer formed around an outer circumference of the core; and a plurality of superconductive wires arranged on an outer circumference of the stabilizing layer of the core material, wherein the core is composed of a material having higher strength in comparison to the stabilizing layer; and the plurality of superconductive wires are integrated with the core material through the stabilizing layer.

By integrating the plurality of superconductive wires with the core material, it is possible to prevent each of the superconductive wires from deviating when the superconductive wires are wound around the core.

EXAMPLE EFFECT OF INVENTION

According to one or more embodiments, it is possible to provide a superconductive conductor exhibiting an excellent superconductive characteristic without causing problems regarding its shape such as local protrusions and a method for producing such a superconductive conductor.

DESCRIPTION OF PREFERRED EMBODIMENTS

In the following, embodiments for carrying out the present invention (hereinafter referred to as embodiments) will be described in detail with reference to the accompanying drawings.

In the embodiments of the present invention, "a superconductive wire" refers to a superconductive conductor in a state where an intermediate layer, a superconductive layer and a protective layer are deposited and laminated in this order on a small width deposition substrate and each superconductive conductor is separated from each other, "a multicore superconductive wire" refers to a superconductive conductor in a state where a plurality of the superconductive wires are arranged in parallel with a longitudinal direction thereof on a substrate or stabilizing material having a large width and are integrated therewith along entire length of the respective superconductive wires, and "a complex superconductive conductor" refers to a superconductive conductor in a state where the superconductive wires or the multicore superconductive wire (s) is wound around an outer circumference of a core material.

First Embodiment

Figure 1:
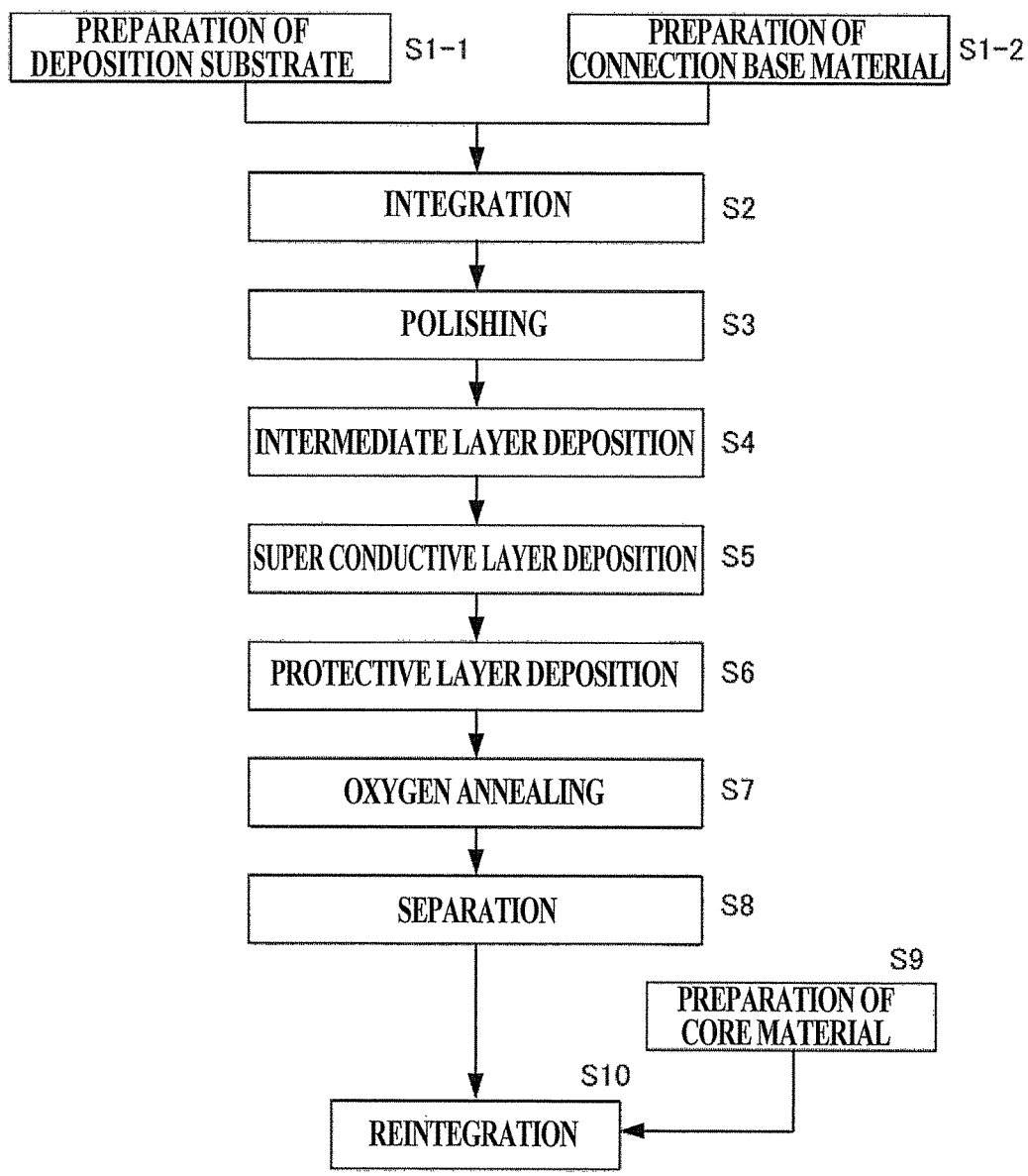
FIG. 1 is a flow diagram showing a production process of a superconductive conductor according to an embodiment of the present invention.

With respect to the first embodiment of the present invention, a method of producing a round shape complex superconductive conductor will be described. In the method, a plurality of small width deposition substrates are embedded into and integrated with a connection base material and an intermediate layer, a superconductive layer and a protective layer are deposited on the small width deposition substrates and treated with an oxygen annealing, then, the plurality of small width deposition substrates are separated from the connection base material to produce superconductive wires in units of the respective deposition substrates. The resulting superconductive wires are wound around an outer circumference of a round shape core wire and are reintegrated therewith to produce the round shape complex superconductive conductor. FIG. 1 is a flow diagram showing principal processes.

<Preparation of a Small Width Deposition Substrate (Step S1-1)>

A metal wire is shaped so as to have a predetermined cross-sectional dimension. Metal to be employed preferably has material strength larger than 100 in Hv hardness, and alloys including Cu, Ni, Ti, Mo, Nb, Ta, W, Fe and/or Ag may be employed. Particularly preferable are stainless and Hastelloy™ and other nickel alloys which exhibit excellent corrosion resistance and heat resistance. The metal wire may have either round or non-round cross-section and may have a rectangular cross-section or a trapezoidal cross-section. The cross-sectional shape of the metal wire is not limited to a specific shape. The width of the deposition substrate is preferably about 0.1 to 4.0 mm and more preferably 0.3 to 2 mm. If the width of the deposition substrate is smaller than 0.1 mm, the rigidity of the deposition substrate decreases and bending strain may cause deterioration of superconductive characteristic. If the width of the deposition substrate is greater than 4.0 mm, the properties relating to alternating current are adversely affected.

<Preparation of a Connecting Base Material (Step S1-2)>

In accordance with a dimension of the small width deposition substrate, a base material having a predetermined cross-sectional dimension is formed as the connection base material such that the base material is provided with a plurality of grooves parallel with each other at a predetermined pitch for embedding the small width deposition substrates therein. Material to be employed for the connection base material is preferably a metal having high heat conductivity and, in particular, an alloy similar to that employed for the metal wire is preferable.

Each groove can be formed by using a convex forming roll corresponding to a concave shape of the groove. However, the groove may be formed by laser and may also be formed by a combination of laser and a convex forming roll. Etching by an acid solution may also be used, for example. A combination of the etching by an acid solution, laser and/or the convex forming roll may be used.

The shape of the groove is preferably a concave shape which has a base and an upper side having lengths equal to each other. However, the trapezoidal shape having a base longer than an upper side such that the small width deposition substrate can be held by the groove is more preferable.

If a support which has a heating function is used on a back side (a side opposite to a deposition surface) of the deposition substrate when deposition is carried out, a thickness of a part of the connection base material where the groove is provided is preferably equal to or smaller than a thickness of the deposition substrate. It is not preferable that the thickness of the connection base material is greater than the thickness of the deposition substrate at such a part because heat from the support is not easily transmitted to the connection base material.

The distance (the predetermined pitch) between the grooves can be arbitrarily determined. However, it is preferable to set such a distance that the intermediate layers and the superconductive layers respectively deposited on neighboring deposition substrates do not affect each other. The distance between the grooves is preferably determined so as to be equal to or greater than a distance along a thickness direction of the deposition substrate between a surface position of a deposition surface and a surface position of the connection base material where no groove is formed.

<Integrating Process of the Small Width Deposition Substrates and the Connection Base Material (Step S2)>

Figure 2:
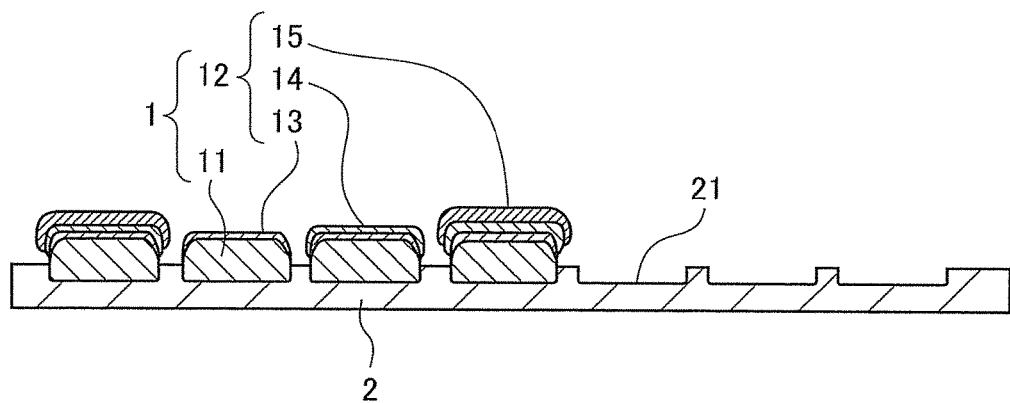
FIG. 2 is a cross-sectional view showing a state of deposition on a small width deposition substrate embedded in a connection base material according to an embodiment of the present invention.

The small width deposition substrates are respectively embedded into a plurality of the parallel grooves formed on the connection base material with a predetermined pitch, and the deposition substrates and the connection base material are integrated. FIG. 2 is a cross-sectional view illustrating an example in which the small width deposition substrates 11 are embedded into and integrated with seven grooves 21 formed on the connection base material 2.

In order to ensure flatness of the small width deposition substrate 11, TA (tension anneal) can be applied in the integrated state.

In a case where a metal wire having a round (ellipsoidal) cross-section is embedded into the trapezoidal groove described above, such a method to integrate the metal wire and the groove can be applied that, when the metal wire is put in the groove to be integrated with the groove, the upper arched portion of the embedded metal wire is shaped flat such that the flat portion becomes a highly smooth surface. In this case, it is not necessary to strengthen the deposition substrate, and by forming the connection base material as a strength member, it becomes possible to set a difference in strength in the base material. A combination of different materials or the same material may be chosen for the connection base material and metal wire.

Different finished flatness can be achieved with respect to the small width deposition substrate 11 and the connection base material 2. The arithmetic mean roughness Ra of the connection base material 2 can be set to be relatively low (Ra is equal to or greater than 10 nm and equal to or smaller than 100 nm), and thus, resulting in great effects relating to the improvement in productivity in a plate rolling process, the improvement in yield and the cost reduction owing to, for example, use of non-expensive material by appropriate material choice.

<Polishing Process (Step S3)>

After the small width deposition substrate 11 and the connection base material 2 are integrated with each other, a deposition surface side of the small width deposition substrate 11 is formed to be a highly smooth surface by means of mechanical polishing, electrolytic polishing or chemical polishing. The arithmetic mean roughness Ra of the deposition surface is preferably equal to or smaller than 5 nm and more preferably equal to or smaller than 2 nm.

By carrying out polishing in a state where the deposition substrates 11 and the connection base material 2 are integrated with each other, it is possible to easily make heights of the deposition surfaces, smoothness (Ra) of the polished surfaces and normal directions of the polished surfaces uniform and constant.

A principal surface on the deposition surface side may have a non-deposition surface at an end (a corner and a side surface) in a width direction of the deposition surface. An arithmetic mean roughness Ra of the non-deposition surface is preferably equal to or greater than 15 nm. Thereby, the degree of orientation of the superconductive layer 14 and/or the intermediate layer 13 can be intentionally decreased at the corner and the side surface (the non-deposition surface) of the deposition substrate, and thus, embodiments are possible where the superconductive layers 14 on the neighboring deposition substrates 11 in the width direction do not have a continuous orientation. The degree of orientation of the non-deposition surface including the intermediate layer and the superconductive layer deposited on concaved portion between the deposition substrates can also be controlled.

Thereby, even after the separation step in Step S8, it is possible to keep high orientation at the end(s) in the width direction of the deposition substrate, and thus, the superconductive layer 14 which is highly oriented over the entire width of the substrate can be obtained. Furthermore, it is possible to control unnecessary paths for electric current caused by the non-deposition surface including the intermediate layer and the superconductive layer deposited on the concaved portion between the deposition substrates.

In particular, in a case where a multicore superconductive wire is used as it is after the deposition, a superconductive layer 14 can be deposited in a state where a distance between the neighboring deposition substrates is small. Therefore, it is possible to control a size of the gap between the superconductive layers 14 constituting a multicore superconductive layer to be small. Namely, electric current density (Je) of the entire multicore superconductive wire can be increased.

<Intermediate Layer Deposition Process (Step S4)>

The intermediate layer 13 is a layer (s) formed on the small width deposition substrate 11 to realize a high degree of orientation along a surface of the superconductive layer 14, and the physical characteristic values such as a coefficient of thermal expansion and a lattice constant show intermediate values between those of the substrate and those of an oxide superconductor constituting the superconductive layer. The intermediate layer 13 may be a single layer or a multilayer composed of two or more layers. Embodiments are possible where the intermediate layer 13 includes a bed layer, a biaxially oriented layer and a cap layer, for example.

[Bed Layer]

With respect to a constituent material for the bed layer, $Gd_2Zr_2O_{7-\delta}$ ($-1<\delta<1$, hereinafter referred to as GZO), $YAlO_3$ (yttrium aluminate), YSZ (yttria-stabilized zirconia), $Y_2O_3$, $Gd_2O_3$, $Al_2O_3$, $B_2O_3$, $Sc_2O_3$, REZrO or $RE_2O_3$ can be employed, for example, and GZO, $Y_2O_3$ and YSZ are appropriate among them, where RE represents a single rare-earth element or a plurality of rare-earth elements. The bed layer may have a function to improve biaxial orientation, for example. For the bed layer to have the function to improve biaxial orientation, employing GZO as the constituent material for the bed layer is preferable. The film thickness of the bed layer is not limited to a specific value, but, for example, is equal to or greater than 10 nm and equal to or smaller than 200 nm.

With respect to a deposition method of the bed layer, a deposition method which employs an RF sputtering in argon atmosphere may be cited, for example. In the RF sputtering, inert gas ions (for example, Ar$^+$) generated by plasma discharge collide to a vapor deposition source (for example, GZO) and scattered vapor particles are deposited on a deposition surface to form a film. The deposition condition(s) for this case is set as required in accordance with, for example, the constituent material (s) of the bed layer and the film thickness. For example, the deposition condition is set as follows. RF sputtering power: equal to or greater than 100 W and equal to or smaller than 500 W, substrate transfer speed: equal to or greater than 10 m/h and equal to or smaller than 100 m/h, and deposition temperature: equal to or greater than 20° C. and equal to or smaller than 500° C.

For the deposition of the bed layer, an ion-beam sputtering method may be employed in which ions generated by an ion generator (ion gun) collide to a vapor deposition source. The bed layer may be a multilayer composed of a combination of a layer of $Y_2O_3$ and a layer of $Al_2O_3$, for example.

[Biaxially Oriented Layer]

The biaxially oriented layer is a layer formed on the bed layer for orientating the crystalline superconductive layer in the same direction. As a constituent material for the biaxially oriented layer, a polycrystalline material such as MgO, $CeO_2$, YSZ, NbO are cited. Among them, the constituent material preferably includes MgO. The film thickness of the biaxially oriented layer is not limited to a specific value, but equal to or greater than 1 nm and equal to or smaller than 20 nm, for example.

As a deposition method of the biaxially oriented layer, a sputtering method is preferable in which a target particle is scattered from a target (vapor deposition source) and the scattered target particle is deposited onto the bed layer. A sputtering method in which a film is formed by depositing target particles from a target onto the deposition surface while an ion beam is irradiated obliquely with respect to the deposition surface (IBAD method: Ion Beam Assisted Deposition) is particularly preferable.

The deposition condition(s) in this case is set as required in accordance with, for example, the constituent material(s) of the biaxially oriented layer and the film thickness. For example, the following deposition conditions are preferable:
IBAD assist ion beam voltage: equal to or greater than 800 V and equal to or smaller than 1500 V;
IBAD assist ion beam current: equal to or greater than 80 mA and equal to or smaller than 350 mA;
IBAD assist ion beam acceleration voltage: 200V;
RF sputtering power: equal to or greater than 800 W and equal to or smaller than 1500 W;
substrate transfer speed: equal to or greater than 80 m/h and equal to or smaller than 500 m/h; and
deposition temperature: equal to or greater than 5° C. and equal to or smaller than 250° C.

<Superconductive Layer Deposition Process (Step S5)>

The superconductive layer 14 is preferably composed of an oxide superconductor, particularly a copper oxide superconductor, formed on the intermediate layer 13. As the copper oxide superconductor, a crystalline material having a composition formula of $REBa_2Cu_3O_{7-\delta}$ (referred to as RE-123), for example, may be adopted.

RE in the composition formula $REBa_2Cu_3O_{7-\delta}$ represents a single rare-earth element or a plurality of rare-earth elements such as Y, Nd, Sm, Eu, Gd, Dy, Ho, Er, Tm, Yb and Lu, among which Y is often employed. $\delta$ represents oxygen non-stoichiometry, which is, for example, equal to or greater than 0 and equal to or smaller than 1. From the point of view of the transition temperature of the superconductor is high, $\delta$ is preferably close to 0.

The film thickness of the superconductive layer is not limited to a specific value, but equal to or greater than 0.8 µm and equal to or smaller than 10 µm, for example.

As a deposition method of the superconductive layer 14, a TFA-MOD method, a PLD method, a MOCVD method or a sputtering method may be adopted, for example. Among these deposition methods, adopting the MOCVD method is preferable because high vacuum is not necessary and increasing a surface area is easy, and thus, has excellent characteristic for mass production.

The deposition condition(s) for the MOCVD method is set as required in accordance with, for example, the constituent material (s) of the superconductive layer 14 and the film thickness. For example, the following deposition conditions are preferable:
substrate transfer speed: equal to or greater than 80 m/h and equal to or smaller than 500 m/h; and
deposition temperature: 800° C. to 900° C.
From the point of view that the superconductive property needs to be enhanced by decreasing the oxygen non-stoichiometry 5, the MOCVD method is preferably carried out in oxygen atmosphere.

<Protective Layer Deposition Process (Step S6)>

The protective layer (stabilizing layer) 15 composed of Ag, for example, is deposited on the superconductive layer 14 by a sputtering method, for example.

<Oxygen Annealing Process (Step S7)>

Oxygen annealing is carried out at 550° C. in an oxygen flow, for example, to give a predetermined superconductive property to the superconductive layer.

<Separation Process (Step S8)>

Small width deposition substrates 11 each having the protective layer 15 deposited on the superconductive layer 14 are separated from the connection base material 2 by a separation device from a state where the small width deposition substrates 11 are embedded in the connection base material 2. As a result, a plurality of the superconductive wires are obtained.

The separation device is composed of a rewinding line (s) including a feed device which feeds the connection base material 2 integrated with a plurality of the small width deposition substrates 11, a winding device which winds each small width deposition substrate 11 and the connection base material 2 which are separated from each other, and a guide roll having a section similar to that of a drum which is located between the feed device and the winding device. During the separation, a surface of the connection base material 2 opposite to the surface into which the small width deposition substrates 11 are embedded is contacted and passed along a center part of an arched upper surface of the guide roll which has a section similar to that of a drum. Each groove 21 into which the small width deposition substrate 11 is embedded is slightly opened, whereby each small width deposition substrate 11 is separated and is obtained as the superconductive wire 1 without causing any mechanical stress, deformation and the like in the deposition layer 12 composed of the intermediate layer 13, the superconductive layer 14 and the protective layer 15 deposited on the small width deposition substrate 11. The connection base material 2 made of a metal is discontinuous on a side on which the grooves 21 are formed, and thus, exhibits an excellent bendability along the width direction thereof when the surface on which the groove 21 is formed is oriented outside.

Now, a plurality of the superconductive wires 1 each including the deposition layer 12 composed of the intermediate layer 13, the superconductive layer 14 and the protective layer 15 are wound around the outer circumference of the core material and integrated therewith to form the complex superconductive conductor. As an example, a case will be described where a round shape core material is employed.

<Preparation of a Round Shape Core Material (Step S9)>

Figure 3:
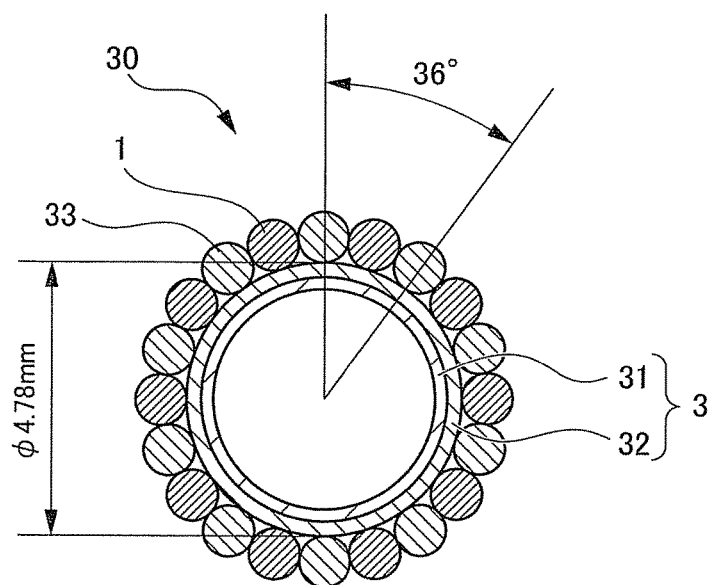
FIG. 3 is a cross-sectional view showing a structure of the superconductive conductor according to an embodiment of the present invention.

As shown in FIG. 3, the round shape core material 3 is prepared which includes a cross-sectional hollow reinforcing core 31 and a stabilizing layer 32 (of copper or copper alloy, for example) around an outer circumference of the reinforcing core 31. In FIG. 3, for the purpose of illustration, the superconductive wires and fins are shown as having circular cross-sections. The stabilizing layer 32 around the outer circumference is provided with the fins 33 to prevent the sides of the superconductive wires 1 from contacting each other, and the cross-sectional shape of the outer circumference of the core material 3 is corrugated. The fins formed of an insulator may be arranged on the surface of the stabilizing layer. A height of each fin 33 is preferably close to a thickness of the superconductive wire 1, but does not have to be nearly the same as the thickness of the superconductive wire 1. A material for the cross-sectional hollow core 31 is preferably a Fe-based low magnetic material, but may be a Ni-based material such as hastelloy. The cross-sectional structure may be a solid structure or a clad structure. The core 31 is formed of a material having higher strength in comparison to that of the stabilizing layer 32. In particular, in a case where the stabilizing layer is made of copper or copper alloy, the core 31 preferably has a mechanical characteristic with higher strength in comparison to that of copper or copper alloy. The core 31 preferably has an Hv hardness equal to or greater than 150, and employing a SUS pipe is preferable, for example.

<Reintegration Process (Step S10)>

The superconductive wires 1 are embedded in grooves formed between the fins 33, whereby a plurality of the superconductive wires 1 are integrated with the core material 3 and are wound around the outer circumference of the core material 3. Thus, a round shape complex superconductive conductor 30 is obtained. The superconductive wire 1 is preferably wound obliquely with respect to the central axis of the core material 3, but the superconductive wire 1 may be arranged in parallel with the central axis of the core material 3. The number of the superconductive wires to be wound may be equal to or greater than two. In that case, winding directions may be the same or different directions and may be alternatively and repeatedly changed.

The superconductive wire 1 may be integrated with the stabilizing layer 32 formed around the outer circumference of the core 31 through a layer where metal diffusion occurs (not shown).

Since the cross-sectional round shape complex superconductive conductor 30 is close to a true circle in its cross-section, each wire is well insulated even when an insulating tape is used and/or varnish is applied. When an insulating tape is used, the deviation of the tape and the break of the insulating tape are prevented. When insulating varnish is used, the shape of the complex superconductive wire after applying insulating varnish is formed so as to be uniform and similar to that of the complex superconductive wire before applying the insulating varnish, and air bubble mixing and local thickness variations specific to varnish are suppressed, and thus, the formation of a portion where insulating breakdown conventionally occurs is suppressed. The cross-sectional shape of the core material is preferably round, but the cross-sectional shape other than a round shape such as a rectangular shape and a round dome shape is applicable.

Example 1

Examples 1 to 4 which relate to the first embodiment mentioned above will be described.

Example 1

In Example 1, a plurality of the superconductive wires are produced which each include a small width deposition substrate having a thickness t 0.05 mm and a width w 1.0 mm produced through the process described in connection with the first embodiment, and a round shape complex superconductive conductor is produced using the obtained superconductive wires.

<Preparation of a Small Width Deposition Substrate (Step S1-1)>

A metal wire (cross-sectional round shape) of hastelloy C276 having a diameter ⌀ 0.31 mm is formed so as to have a thickness t 0.05 mm, a width w 1.0 mm and a length L 1050 m with a processing rate of about 34%.

<Preparation of a Connection Base Material (Step S1-2)>

An alloy strip of hastelloy C276 having t 0.15 mm, w 26.5 mm and L 105 m is provided with ten grooves parallel with each other along the entire length of the alloy strip at a pitch of 2.5 mm along a width direction to be formed as a connection base material. Each groove has a depth d 0.03 mm and a width w 1.0 mm.

<Integrating Process of the Small Width Deposition Substrates and the Connection Base Material (Step S2)>

The small width deposition substrates are embedded into the ten grooves formed on the connection base material and the small width deposition substrates and the connection base material are integrated.

<Polishing Process (Step S3)>

The surfaces of the small width deposition substrates and the connection base material which are integrated with each other are polished such that the surface roughness becomes 1.1 nm in an arithmetic mean roughness Ra.

<Intermediate Layer Deposition Process (Step S4)>

A layer of Gd2Zr2O7 (GZO) (film thickness: 110 nm) is deposited on the polished surfaces of the small width deposition substrates of hastelloy C276 at room temperature by means of an ion beam sputtering method. A layer of MgO (film thickness: about 5 nm) is deposited at a temperature from 200 to 300° C. by means of an IBAD method. A layer of LaMnO3 (film thickness: 30 nm) is deposited at a temperature from 600 to 700° C. by means of an RF sputtering method. A layer of CeO2 (film thickness: 400 nm) is deposited at a temperature from 500 to 600° C. by means of an RF sputtering method.

<Superconductive Layer Deposition Process (Step S5)>

A superconductive layer of $YG_dBa_2Cu_3O_{7-d}$ is deposited on the intermediate layer at a thickness of 1 μm under a condition of 800° C. by means of an MOCVD method.

<Protective Layer Deposition Process (Step S6)>

A layer of Ag is deposited on the superconductive layer at a thickness of 15 μm as a protective layer.

<Oxygen Annealing Process (Step S7)>

In a state where the ten small width deposition substrates of hastelloy C276 having w 1.0 mm and L 105 m are embedded in the connection base material with the intermediate layer, the superconductive layer and the protective layer deposited on each small width deposition substrate, oxygen annealing is carried out at 550° C. in an oxygen flow and a multicore superconductive wire is obtained.

<Separation Process (Step S8)>

The multicore superconductive wire including ten superconductive conductors embedded in the connection base material is separated by a separation device and a plurality of superconductive wires are obtained.

<<Characteristic Relating to a Critical Current of the Superconductive Wire>>

The critical current $I_c$ was measured with respect to the thus produced ten superconductive wires soaked in liquid nitrogen which each have the width w of 1 mm and the length L of 100 m by means of a four-terminal method with a criterion of 1 μv/cm. The measurements were carried out with a pitch of 1 m and the distance between voltage terminals was set to be 1.2 m.

The critical current $I_c$ equal to or greater than 45 A was confirmed at all measurement points. The critical current $I_c$ measured on a superconductive wire produced as a comparative example in a similar fashion from a substrate having a width of 10 mm was 455 A. Therefore, it was confirmed that the critical currents occurred corresponding to a width ratio of the wire having the width of 1 mm to the wire having the width of 10 mm.

<Preparation of a Core Material (Step S9)>

With respect to a round shape core material including a core formed from a cross-sectional hollow SUS pipe and a stabilizing layer of copper located on an outer circumference of the SUS pipe, the radially outermost stabilizing layer of copper is provided with fins in such a manner that sides of the superconductive wires having a width of 1 mm do not contact each other in order to prepare a core material having a cross-sectional corrugated outer circumference. The distance (R) between the bottom of the corrugations and the center of the cross-sectional round shape is set to be 2.39 mm, and the outer circumference of the core material is provided with ten fins each having a width of 0.47 mm at a pitch of 36°.

<Reintegration Process (Step S10)>

The superconductive wires having the width of 1 mm is embedded in grooves having a width pitch of about 1 mm formed between these ten fins, and a cross-sectional round shape complex superconductive conductor with an outer diameter ⌀ 4.8 mm having a multicore structure including ten wires as schematically shown in FIG. 3 is obtained.

<<Characteristic Relating to a Critical Current of the Complex Superconductive Conductor>>

With respect to the round shape complex superconductive conductor with an outer diameter ⌀ 4.8 mm including ten superconductive wires each having a width of 1 mm, the critical current $I_c$ was 455 A. It was confirmed that the critical current occurred corresponding to the width ratio of the wire having the width of 1 mm to the wire having the width of 10 mm and that the characteristic relating to the critical current of the superconductive wire was not deteriorated by the reintegration process.

Example 2

In Example 2, a plurality of the superconductive wires are produced which each include a small width deposition substrate having a thickness t 0.1 mm and a width w 2.0 mm produced through the process described in connection with the first embodiment. In the following, the description will be given only with respect to Step S1-1, S1-2 and S2. The description with respect to the other Steps (S3 to S8) will be omitted because these Steps are similar to those in Example 1.

<Preparation of a Small Width Deposition Substrate (Step S1-1)>

A metal wire (cross-sectional round shape) of hastelloy C276 having a diameter ⌀ 0.62 mm is shaped so as to have a thickness t 0.1 mm, a width w 2.0 mm and a length L 740 m with a processing rate of about 34%.

<Preparation of a connection base material (Step S1-2)>

An alloy strip of hastelloy C276 having a thickness t 0.2 mm, a width w 26.5 mm and a length L 105 m is provided with seven grooves parallel with each other along the entire length of the alloy strip at a pitch along a width direction of 3.5 mm to be formed as a connection base material. Each groove has a depth d 0.08 mm and a width w 2.0 mm.

<Integrating Process of the Small Width Deposition Substrates and the Connection Base Material (Step S2)>

The small width deposition substrates are embedded into the seven grooves formed on the connection base material and the small width deposition substrates and the connection base material are integrated.

Processes similar to those of Example 1 follow. The intermediate layer, the superconductive layer and the protective layer are deposited. Oxygen annealing is carried out. The multicore superconductive wire including seven superconductive conductors embedded in the connection base material is separated to the superconductive wires and the connection base material by the separation device and the plurality of superconductive wires are obtained.

<<Characteristic Relating to a Critical Current of the Superconductive Wire>>

The critical current $I_c$ was measured with respect to the thus produced seven superconductive wires soaked in liquid nitrogen which each have the width w of 2 mm and the length L of 100 m by means of a four-terminal method with an electric field criterion of 1 μv/cm. The measurements were carried out with a pitch of 1 m and the distance between voltage terminals was set to be 1.2 m.

The critical current $I_c$ equal to or greater than 90 A was confirmed at all measurement points. The critical current $I_c$ measured on a superconductive wire produced as a comparative example in a similar fashion from a substrate having a width of 10 mm was 455 A. Therefore, it was confirmed that the critical currents occurred corresponding to a width ratio of the wire having the width of 2 mm to the wire having the width of 10 mm.

Example 3

In Example 3, a plurality of the superconductive wires are produced which each include a small width deposition substrate having a thickness t 0.15 mm and a width w 3.0 mm produced through the process described in connection with the first embodiment. In the following, the description will be given only with respect to Step S1-1, S1-2 and S2. The description with respect to the other Steps (S3 to S8) will be omitted because these Steps are similar to those in Example 1.

<Preparation of a Small Width Deposition Substrate (Step S1-1)>

A metal wire (cross-sectional round shape) of hastelloy C276 having a diameter ⌀ 0.95 mm is shaped so as to have a thickness t 0.15 mm, a width w 3.0 mm and a length L 550 m with a processing rate of about 37.

<Preparation of a Connection Base Material (Step S1-2)>

An alloy strip of hastelloy C276 having a thickness t 0.25 mm, a width w 26.5 mm and a length L 105 m is provided with five grooves parallel with each other along the entire length of the alloy strip at a pitch along a width direction of 4.5 mm to be formed as a connection base material. Each groove has a depth d 0.13 mm and a width w 3.0 mm.

<Integrating Process of the Small Width Deposition Substrates and the Connection Base Material (Step S2)>

The small width deposition substrates are embedded into the five grooves formed on the connection base material and the small width deposition substrates and the connection base material are integrated.

Processes similar to those of Example 1 follow. The intermediate layer, the superconductive layer and the protective layer are deposited. Oxygen annealing is carried out. The multicore superconductive wire including five superconductive conductors embedded in the connection base material is separated to the superconductive conductors and the connection base material by the separation device and the plurality of superconductive wires are obtained.

<<Characteristic Relating to a Critical Current of the Superconductive Wire>>

The critical current $I_c$ was measured with respect to the thus produced five superconductive wires soaked in liquid nitrogen which each have the width w of 3 mm and the length L of 100 m by means of a four-terminal method with a criterion of 1 μv/cm. The measurements were carried out with a pitch of 1 m and the distance between voltage terminals was set to be 1.2 m.

The critical current $I_c$ equal to or greater than 136 A was confirmed at all measurement points. The critical current $I_c$ measured on a superconductive wire produced as a comparative example in a similar fashion from a substrate having a width of 10 mm was 455 A. Therefore, it was confirmed that the critical currents occurred corresponding to a width ratio of the wire having the width of 3 mm to the wire having the width of 10 mm.

Example 4

In Example 4, a plurality of the superconductive wires are produced which each include a small width deposition substrate having a thickness t 0.2 mm and a width w 4.0 mm produced through the process described in connection with the first embodiment. In the following, the description will be given only with respect to Step S1-1, S1-2 and S2. The description with respect to the other Steps (S3 to S8) will be omitted because these Steps are similar to those in Example 1.

<Preparation of a Small Width Deposition Substrate (Step S1-1)>

A metal wire (cross-sectional round shape) of hastelloy C276 having a diameter ∅ 1.3 mm is shaped so as to have a thickness t 0.2 mm, a width w 4.0 mm and a length L 440 m with a processing rate of about 40%.

The processing rate of the metal wire is set to be about to about 40%, but the processing rate is not limited to this range. In accordance with a material to be employed for the metal wire, the processing rate corresponding to higher deformation (processing rate of about 60 to 80%, for example) can be adopted. In a case where high deformation is carried out, the processing rate can be increased with use of a complex process in which wire drawing is carried out to a cross-sectional round wire and the cross-sectional round wire is shaped to have a rectangular cross-section, for example.

<Preparation of a Connection Base Material (Step S1-2)>

A strip of hastelloy C276 having a thickness t 0.25 mm, a width w 26.5 mm and a length L 105 m is provided with four grooves parallel with each other along the entire length of the strip at a pitch along a width direction of 5.5 mm to be formed as a connection base material. Each groove has a depth d 0.18 mm and a width w 4.0 mm.

<Integrating Process of the Small Width Deposition Substrates and the Connection Base Material (Step S2)>

The small width deposition substrates are embedded into the four grooves formed on the connection base material and the small width deposition substrates and the connection base material are integrated.

Processes similar to those of Example 1 follow. The intermediate layer, the superconductive layer and the protective layer are deposited. Oxygen annealing is carried out. The multicore superconductive wire including four superconductive conductors embedded in the connection base material is separated to the superconductive wires and the connection base material by the separation device and the plurality of superconductive wires are obtained.

<<Characteristic Relating to a Critical Current of the Superconductive Wire>>

The critical current $I_c$ was measured with respect to the thus produced four superconductive wires soaked in liquid nitrogen which each have the width w of 4 mm and the length L of 100 m by means of a four-terminal method with an electric field criterion of 1 μv/cm. The measurements were carried out with a pitch of 1 m and the distance between voltage terminals was set to be 1.2 m.

The critical current $I_c$ equal to or greater than 182 A was confirmed at all measurement points. The critical current $I_c$ measured on a superconductive wire produced as a comparative example in a similar fashion from a substrate having a width of 10 mm was 455 A. Therefore, it was confirmed that the critical currents occurred corresponding to a width ratio of the wire having the width of 4 mm to the wire having the width of 10 mm.

Comparative Example 1

In Comparative Example 1, an intermediate layer, a superconductive layer and a protective layer are deposited on a hastelloy substrate having a width of 10 mm by means of the method described in connection with the first embodiment mentioned above, oxygen annealing is carried out and five superconductive wires each having a width of 2 mm are obtained by carrying out slit processing by a mechanical slitting method.

<<Characteristic Relating to a Critical Current of the Superconductive Wire>>

The critical current $I_c$ was measured with respect to the thus produced five superconductive wires soaked in liquid nitrogen which each have the width w of 2 mm and the length L of 100 m by means of a four-terminal method with an electric field criterion of 1 μv/cm. The measurements were carried out with a pitch of 1 m and the distance between voltage terminals was set to be 1.2 m.

The critical current $I_c$ was 78 to 85 A at all measurement points. The critical current $I_c$ measured on a superconductive conductor before carrying out the slit processing which was produced from a substrate having a width of 10 mm was 455 A. Since this critical current corresponds to a critical current $I_c$ of about 90 A of the equivalent superconductive conductor having a width of 2 mm, it is confirmed that, in Comparative Example 1, the critical current $I_c$ of the superconductive wires each having a width of 2 mm is deteriorated by the slit processing by about 6 to 14

Second Embodiment

In the second embodiment of the present invention, a plurality of the superconductive wires separated in the first embodiment described above are embedded in the connection base material of Cu or Cu alloy again, or integrated therewith through a layer where metal diffusion occurs. Alternatively, a connection base material of copper or copper alloy may be used instead of hastelloy C276 as the connection base material before deposition, depositing until a protective layer and oxygen annealing may be carried out in an integrated state, and the superconductive wires and the connection base material in the integrated state may be used as they are without a separation process. A depth for embedding the superconductive wires is preferably such a depth that enables a flat embedding in which the deposition surface side of the superconductive wire is level with concaved surfaces of the connection base material. However, the deposition surface side of the superconductive wire may be protruded, depressed or protruded and depressed alternately.

Figure 4:
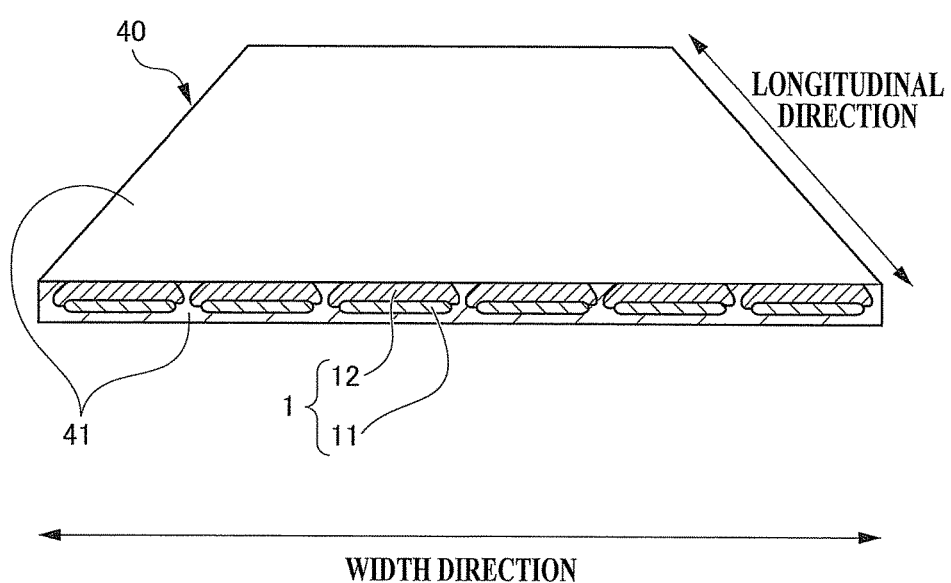
FIG. 4 is a perspective view showing the superconductive conductor according to an embodiment of the present invention.

Now, the deposition surface side of each of a plurality of the superconductive wires embedded in the connection base material of Cu or Cu alloy is covered with primarily an electroplating layer of Cu. As shown in FIG. 4, a multicore superconductive wire 40 is obtained in which, in a cross-section thereof, the deposition layer 12 is sandwiched between the stabilizing layers 41 of Cu with the superconductive layer 14 centered. The stabilizing layer on a side opposite to the deposition layer may be formed of Cu or Cu alloy or may include a clad structure formed by applying a plate material of Cu or Cu alloy.

Thus obtained multicore superconductive wire 40 is wound around the outer circumference of a round shape core similar to that used in the first embodiment to produce a round shape complex superconductive conductor. Since the connection base material of Cu or Cu alloy is formed to be discontinuous at the grooves formed therein, the multicore superconductive wire exhibits excellent bendability along a width direction thereof. Furthermore, the multicore superconductive wire which exhibits excellent bendability can be provided by forming a non-penetrating groove (s) at a part of the multicore superconductive wire between the superconductive wires. Alternatively, by annealing the multicore superconductive wire 40 at about 300° C. in unoxidizing atmosphere, stabilizing copper gets softer, and thus, becomes more preferable with respect to both electrical characteristic and bendability thereof.

Example 5

The ten superconductive wires each having a width of 1 mm obtained in Example 1 is embedded in a connection base material of Cu, and the deposition surface side of each superconductive wire is primarily covered with an electroplating layer of Cu, whereby a multicore superconductive wire including ten cores is obtained in a state where the deposition layer is sandwiched between stabilizing layers of Cu with the superconductive layer centered in a cross-section thereof. The multicore superconductive wire including ten cores is wound around an outer circumference of a round shape core similar to that used in the first embodiment to obtain a round shape complex superconductive conductor.

<<Characteristic Relating to a Critical Current of the Complex Superconductive Conductor>>

The critical current $I_c$ of the round shape complex superconductive conductor including ten superconductive wires each having a width of 1 mm was 455 A. It was confirmed that the critical current was obtained corresponding to a width ratio of the wires having widths of 1 mm and 10 mm, respectively, and that characteristic relating to the critical current of the superconductive wire was not deteriorated through a reintegration and a winding thereof.

Third Embodiment

A complex superconductive conductor can also be obtained by alternately winding the superconductive wire (s) and the multicore superconductive wire employed in the second embodiment. The superconductive wire (s) includes an intermediate layer, a superconductive layer and a protective layer on a small width deposition substrate. In the multicore superconductive wire employed in the second embodiment, a plurality of superconductive wires are embedded in a stabilizing material. Winding directions may be the same directions or opposite directions.

As described in the first to third embodiments and Examples 1 to 5, in the present invention, since the small width deposition substrates formed as thin wires having a desired size are employed, the superconductive wires can be obtained without applying conventional methods such as laser cutting and slit processing. As a result, problems relating to shapes caused by local protrusion on cutting surfaces and problems relating to the deterioration of superconductive characteristic (characteristic relating to a critical current) which is in accordance with thermal history in cutting and which is caused by uneven distortions are improved. In addition, variations in a width dimension resulted from cutting are decreased. Furthermore, the deterioration of superconductive characteristic caused by peeling of each deposition layer and changes in characteristic of the superconductive layer caused by water entry is suppressed, and thus, reliability (stability and uniformity) of applied devices is improved.

In the foregoing, the present invention is described in reference to the embodiments, it is needless to say that the technical scope of the present invention is not limited to the scope described in the embodiments described above.

For example, if a superconductive layer can be formed directly on the substrate, the intermediate layer in the embodiments described above is not necessary. The deposition substrate may be polished before the deposition substrate is integrated with the connection base material. In this case, polishing quality can be controlled before the integration by properly choosing a method for polishing. In this way, it is clear to those skilled in the art that various changes or modifications can be added to the embodiments described above. It is also clear from the recitation of the claims that the embodiments to which such changes or modifications are added can be kept within the technical scope of the present invention.

INDUSTRIAL APPLICABILITY

The present invention is a method for producing a superconductive conductor and a superconductive conductor, which are applicable to superconductive equipment such as a superconducting cable and a superconducting magnet.

DESCRIPTION OF REFERENCE NUMERALS 1 superconductive wire
11 small width deposition substrate
12 deposition layer
13 intermediate layer
14 superconductive layer
15 protective layer 2 connection base material
21 groove
3 core material
30 complex superconductive conductor
31 core
32 stabilizing layer
33 fin
40 multicore superconductive wire
41 stabilizing layer

The invention claimed is:

1. A super conductive conductor, comprising:
a core material, including
a core; and
a stabilizing layer formed around an outer circumference of the core; and
a plurality of superconductive wires arranged on an outer circumference of the stabilizing layer of the core material, wherein
the core is composed of a material having higher strength in comparison to the stabilizing layer,
the plurality of superconductive wires is integrated with the core material through the stabilizing layer,
the plurality of superconductive wires is embedded into grooves on a connection base material, and
deposition surfaces of the plurality of superconductive wires are level with a surface between the grooves on the connection base material.

2. The superconductive conductor according to claim 1, wherein
wherein a superconductive wire of the plurality of superconductive wires includes a deposition substrate and a superconductive layer formed on one of principal surfaces of the deposition substrate;
at least another of the principal surfaces of the deposition substrate of the superconductive wire is connected to one of surfaces of a connection substrate; and
the stabilizing layer is formed so as to contact another of the surfaces of the connection substrate.

3. The superconductive conductor according to claim 1, wherein
an entire surface except longitudinal ends of each of the plurality of superconductive wires is covered with copper or copper alloy; and
the stabilizing layer is formed of copper or copper alloy.

4. A method, comprising:
forming a stabilizing layer of a core material around an outer circumference of a core composed of a material having higher strength in comparison to the stabilizing layer; and
arranging a plurality of superconductive wires on the outer circumference of the stabilizing layer of the core material, comprising integrating the plurality of superconductive wires with the core material through the stabilizing layer, embedding the plurality of superconductive wires into grooves on a connection base material, and leveling deposition surfaces of the plurality of superconductive wires with a surface between the grooves on the connection base material.

5. The method of claim 4, further comprising:
forming a superconductive layer on one of principal surfaces of a deposition substrate of a superconductive wire of the plurality of superconductive wires;
connecting at least another of the principal surfaces of the deposition substrate of the superconductive wire to one of surfaces of a connection substrate; and
forming the stabilizing layer so as to contact another of the surfaces of the connection substrate.

6. The method of claim 4, further comprising:
covering an entire surface except longitudinal ends of each of the plurality of superconductive wires with copper or copper alloy; and
forming the stabilizing layer from copper or copper alloy.

* * * * *